(12) United States Patent
Duan et al.

(10) Patent No.: US 6,977,512 B2
(45) Date of Patent: Dec. 20, 2005

(54) METHOD AND APPARATUS FOR CHARACTERIZING SHARED CONTACTS IN HIGH-DENSITY SRAM CELL DESIGN

(75) Inventors: Franklin Duan, San Jose, CA (US); Subramanian Ramesh, Cupertino, CA (US); Ruggero Castagnetti, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 72 days.

(21) Appl. No.: 10/727,719

(22) Filed: Dec. 4, 2003

(65) Prior Publication Data

US 2005/0122120 A1    Jun. 9, 2005

(51) Int. Cl.[7] .......................... G01R 27/08; G01R 31/26
(52) U.S. Cl. ........................ 324/691; 324/765; 324/766
(58) Field of Search .......................... 324/158.1, 765, 324/755–756, 691, 766; 438/657; 714/718, 714/724; 716/4

(56) References Cited

U.S. PATENT DOCUMENTS

| | | | | |
|---|---|---|---|---|
| 4,896,108 A | * | 1/1990 | Lynch et al. ............... 324/765 |
| 5,450,016 A | * | 9/1995 | Masumori .................. 324/713 |
| 5,838,161 A | * | 11/1998 | Akram et al. ............... 324/765 |
| 6,410,353 B1 | * | 6/2002 | Tsai .......................... 438/14 |
| 6,784,685 B2 | * | 8/2004 | Chao et al. ................ 324/765 |
| 6,815,345 B2 | * | 11/2004 | Zhao et al. ................ 438/657 |
| 6,836,133 B2 | * | 12/2004 | Kinoshita .................. 324/765 |

* cited by examiner

Primary Examiner—Anjan Deb
Assistant Examiner—Marina Kramskaya
(74) Attorney, Agent, or Firm—Yee & Associates, P.C.

(57) ABSTRACT

Test structures are provided for accurately quantifying shared contact resistance. The test structures are built based upon an actual memory cell, which is self-aligning to allow shared contact chains through an array of test cells. A main array of test cells is built to provide a chain of shared contact resistance. Using the main array of test cells, a resistance in the shared contact chain may be measured. Supplemental arrays of test cells is built to provide a chain of poly side resistance, a chain of island side resistance, a chain of island connection line resistance, and a chain of poly connection resistance. A tester measures resistance using the test structures and uses the values to accurately determine shared contact resistance.

18 Claims, 9 Drawing Sheets

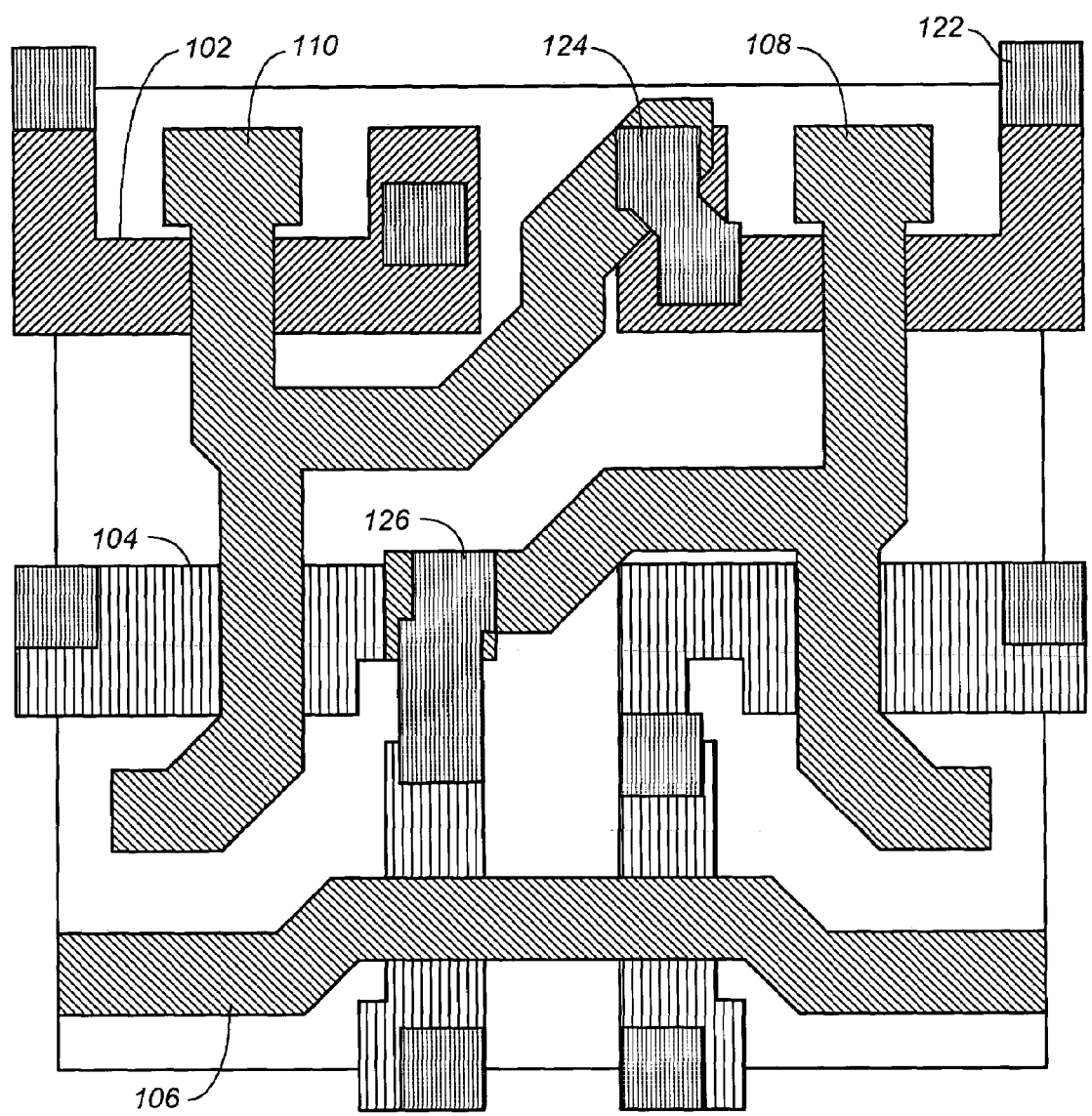
FIG._1A

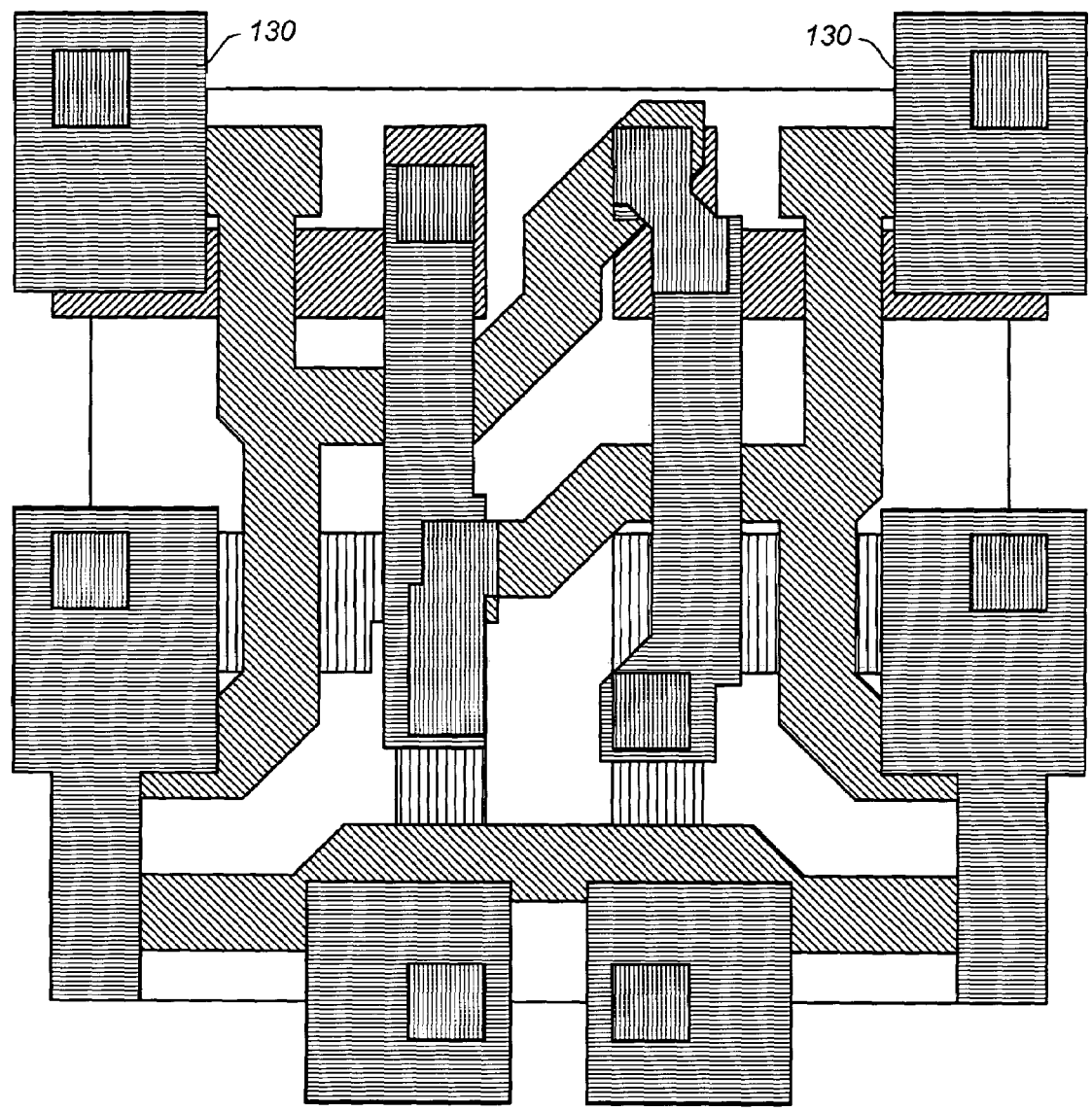
FIG._1B

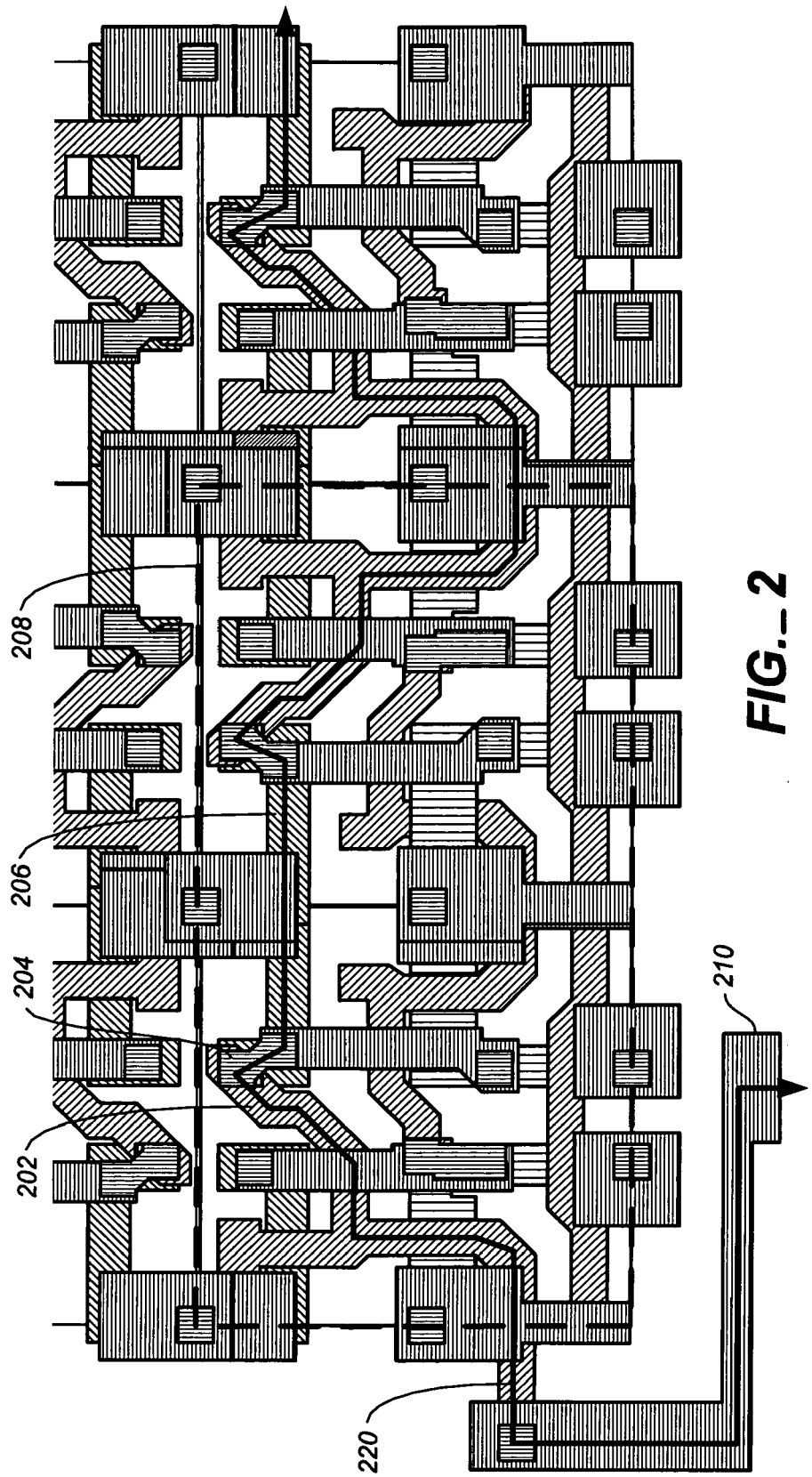
FIG._2

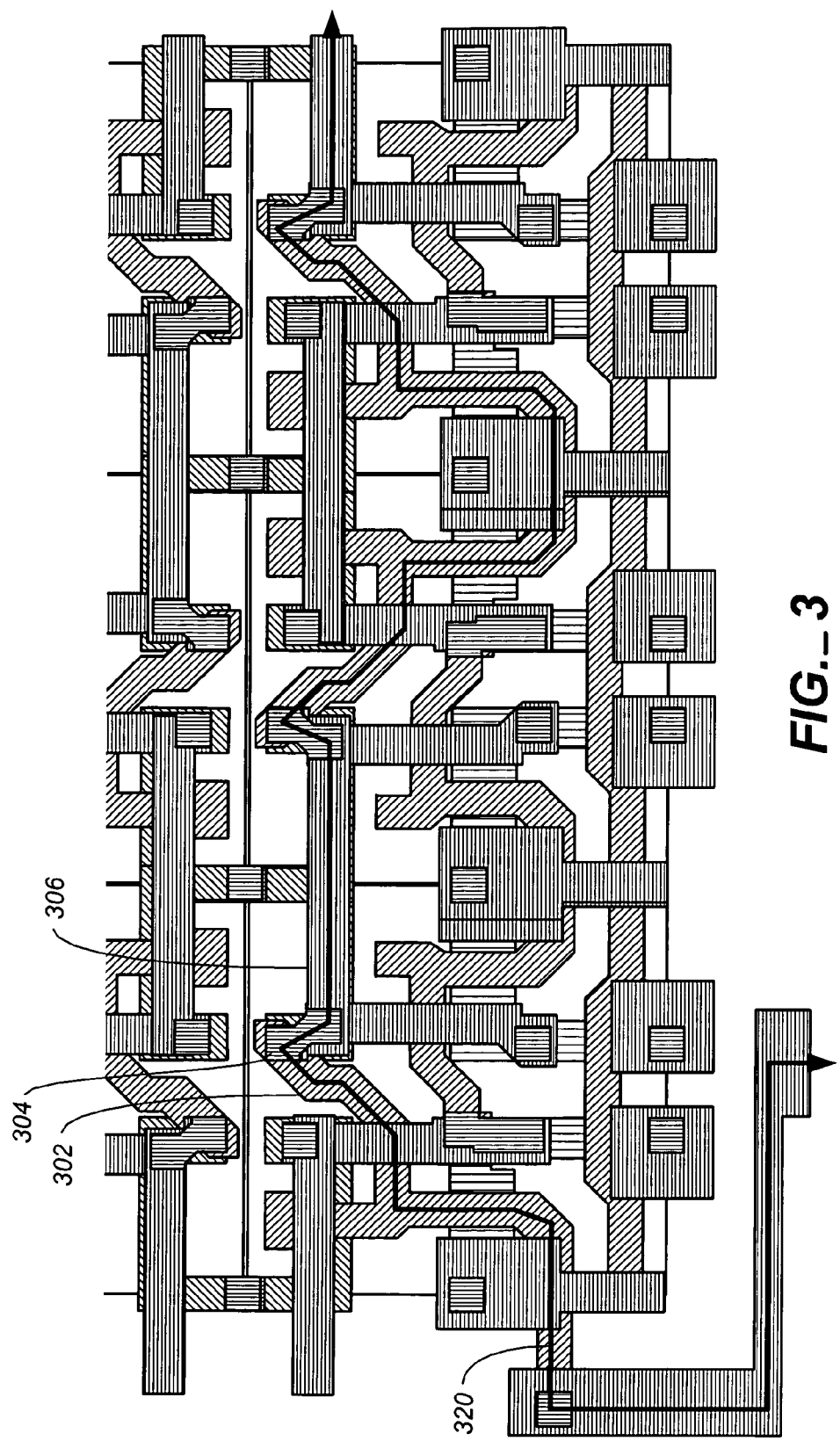
FIG._3

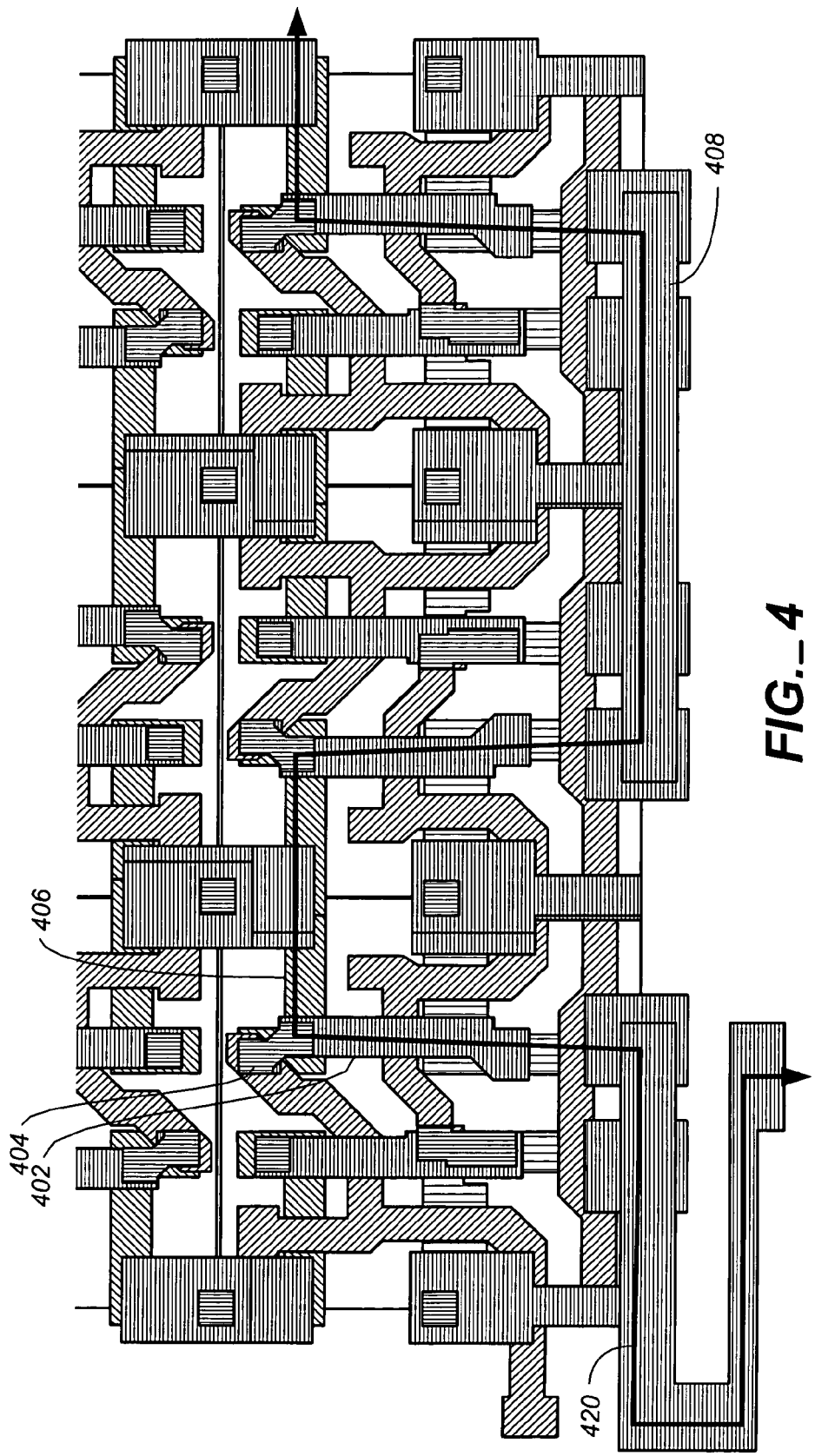
FIG._4

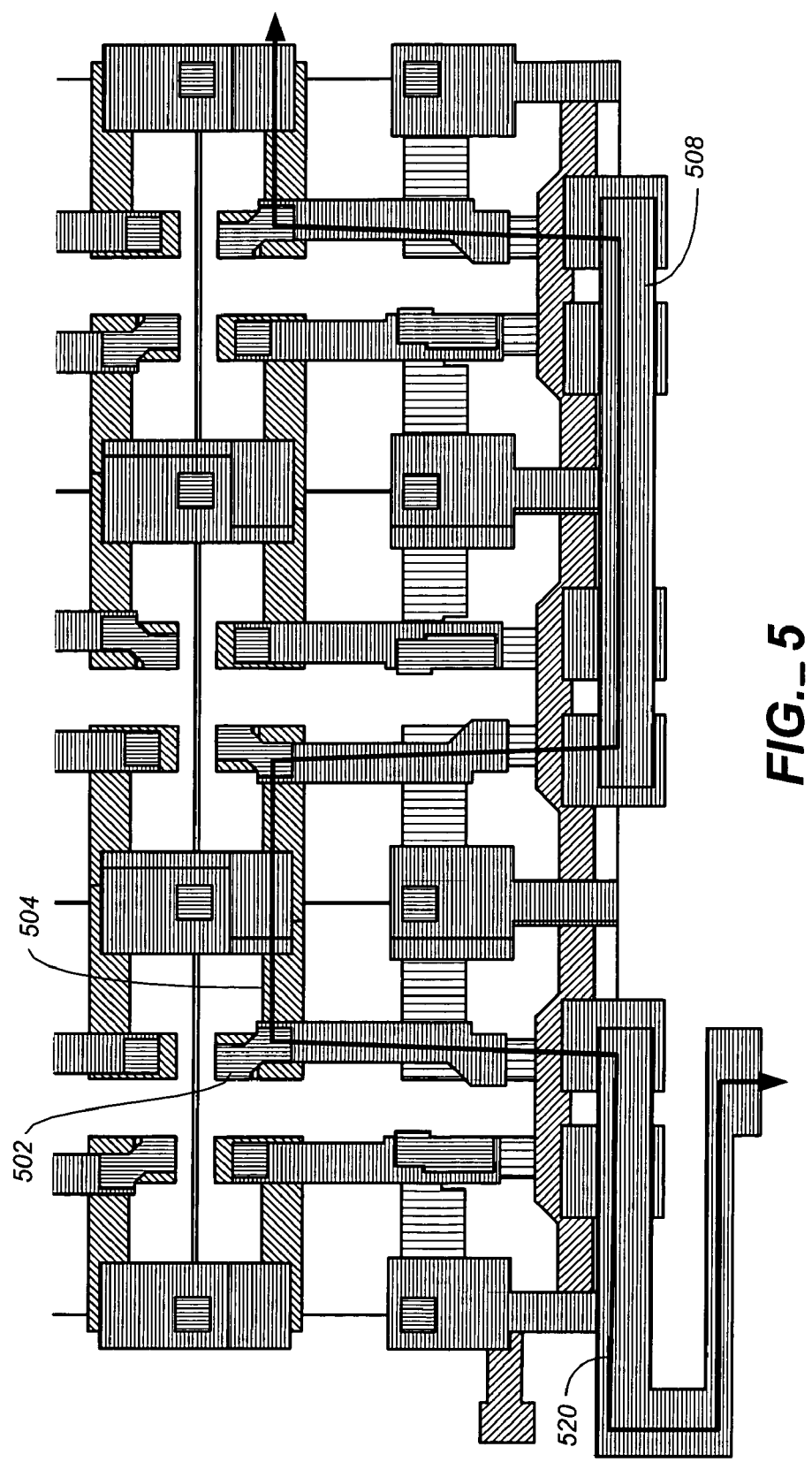
FIG._5

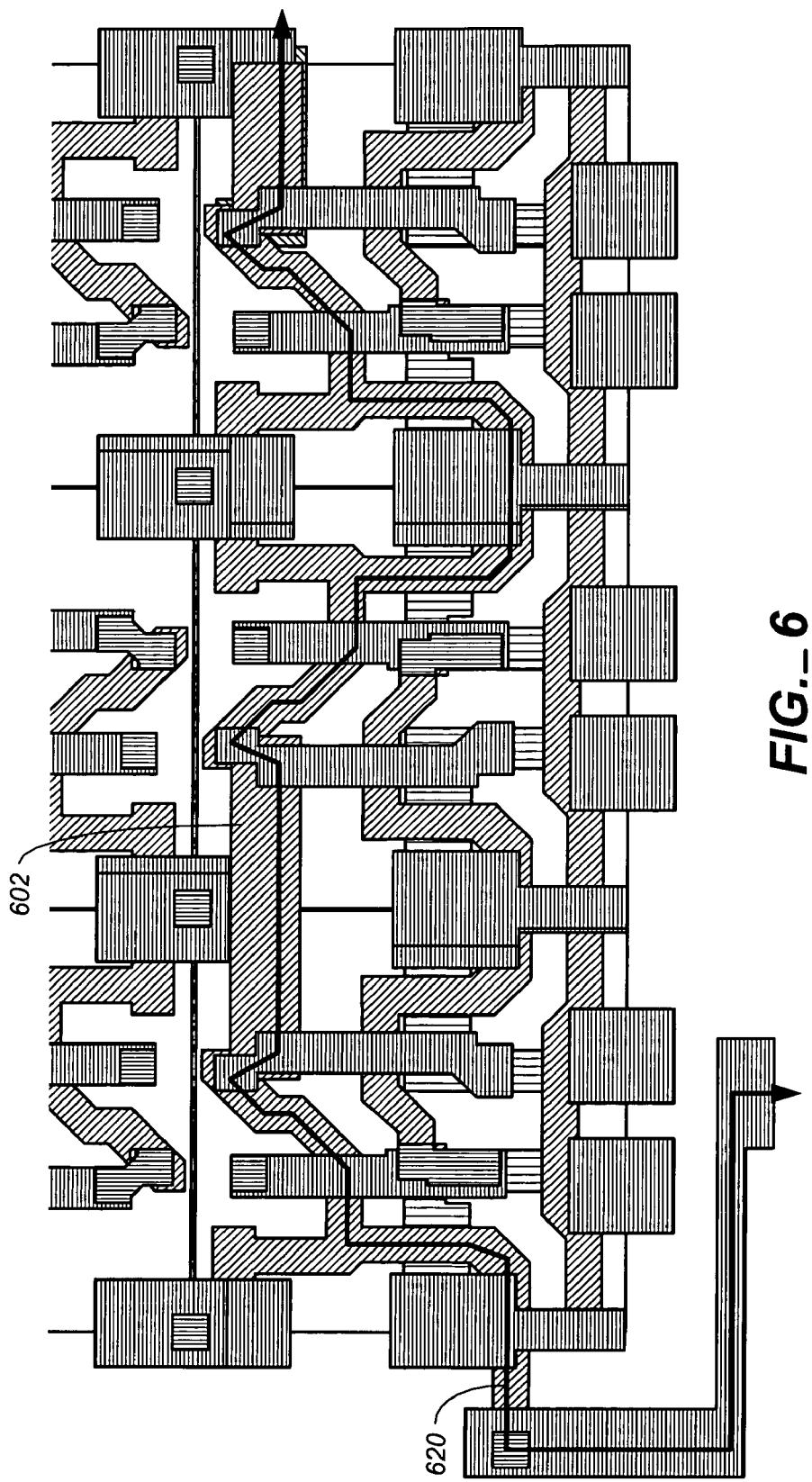
FIG._6

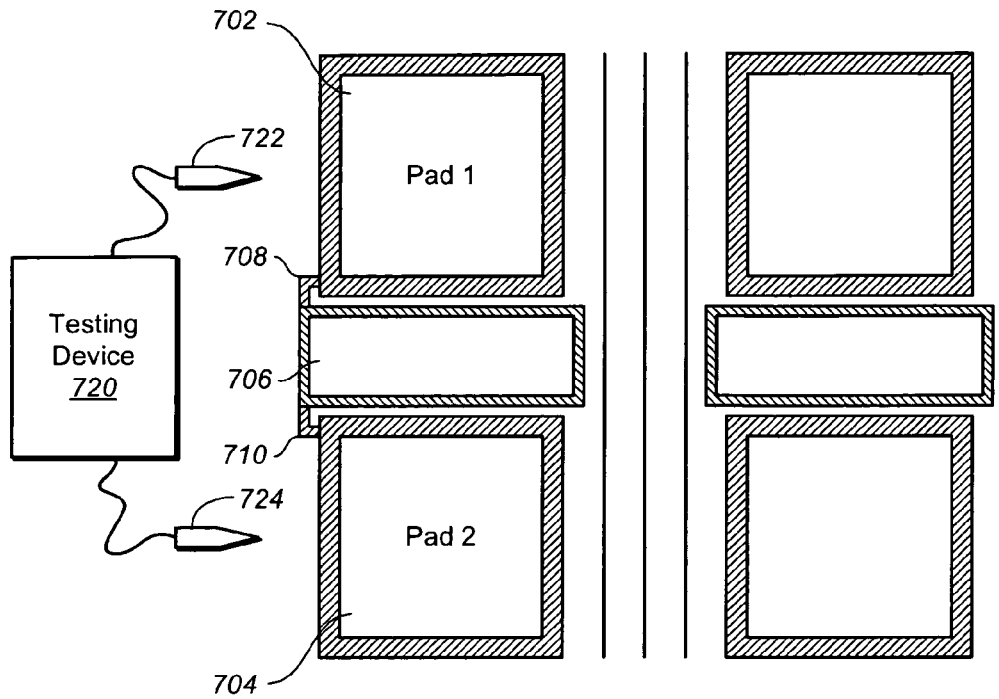
FIG._ 7
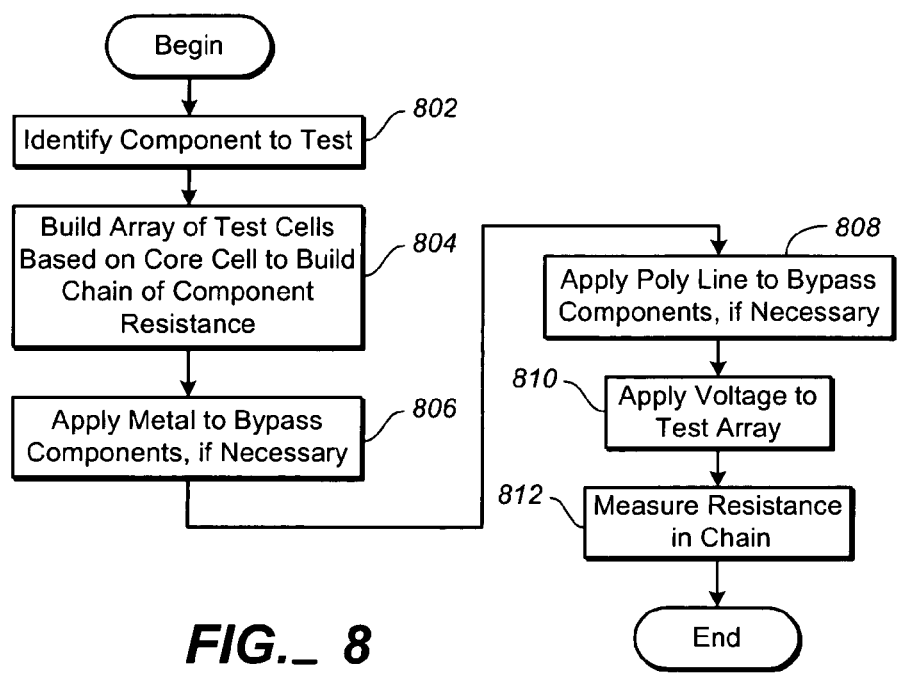
FIG._ 8

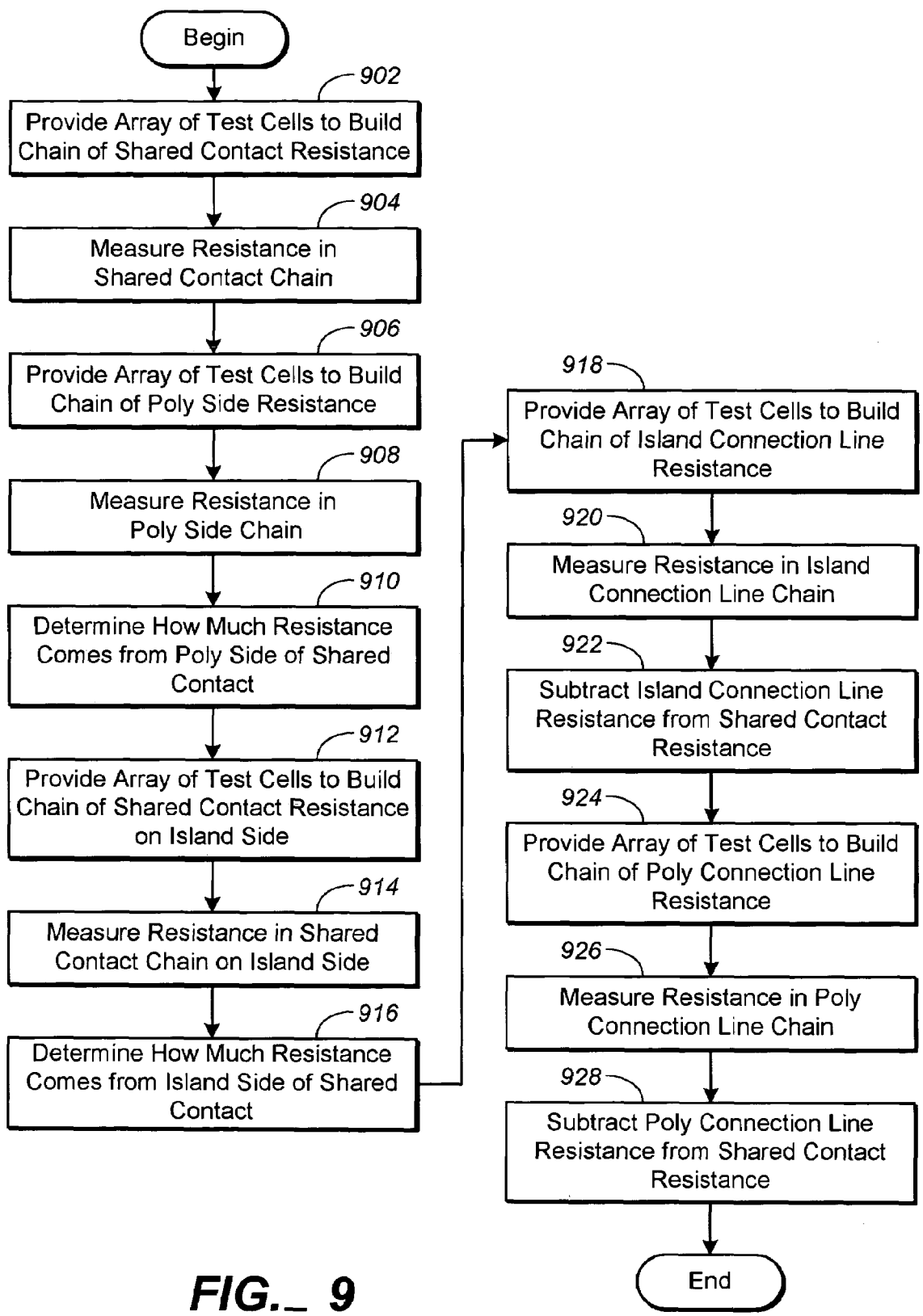
FIG._ 9

METHOD AND APPARATUS FOR CHARACTERIZING SHARED CONTACTS IN HIGH-DENSITY SRAM CELL DESIGN

BACKGROUND OF THE INVENTION

1. Technical Field

The present invention relates to high-density memory design and, in particular, to testing high-density memory cells with shared contacts. Still more particularly, the present invention provides a method and apparatus for characterizing shared contacts in high-density memory cell design.

2. Description of the Related Art

In the computer and electronics industry, there is a constant desire to make circuits, particularly integrated circuits, faster and smaller. Making circuits smaller allows many more components to be packed into a chip, increasing functionality and performance. This is particularly true with memory circuits. Increasing the density of components in a memory chip allows for many more memory cells to be fabricated in a memory chip, thus increasing the amount of memory on chip.

However, higher-density circuits pose several problems. In an integrated circuit, components are formed using channels of highly doped silicon, channels of polysilicon, and layers of insulation. Recently, the channel lengths have decreased from 400 nanometers (nm) to as small as 90 nm and will likely decrease even further. These small channel lengths allow components, particularly transistors, to be tightly packed. However, with these small channel lengths transistors and other components become more difficult to fabricate without defects.

An application specific integrated circuit (ASIC) is a small circuit that may be programmed with customer logic. As the complexity of the customer logic increases, the amount of memory needed also increases. A system on chip (SoC) is an entire system on a single chip. For example, a controller for a digital video disk (DVD) writer may be encompassed on a single chip. The amount of memory, such as static random access memory (SRAM) in a SoC or ASIC device has become larger and larger. However, the memory core takes up real estate on the chip that may be used for application specific logic. Therefore, it has become advantageous to build a very small production memory core cell.

In order to achieve a smaller memory core cell, it has become general practice to adapt shared contact in a high-density SRAM core cell design. A shared contact is a special contact, which connects both silicon island layer and poly layer. If two separate contacts were used to connect poly and silicon instead of one shared contact, the consideration to meet the minimum spacing of contacts and metal 1 would give rise to a larger core cell. Using shared contact indeed saves the space to render a smaller core cell.

The area that the shared contact consumes is usually larger than one regular square contact and its shape may vary depending upon the core cell design. Just as the regular square contact needs to be characterized to ensure the connection between silicon and metal, one must also make sure that the shared contact has proper connection between the metal to both the silicon island and the poly silicon.

SUMMARY OF THE INVENTION

The present invention provides test structures for accurately quantifying shared contact resistance. The test structures are built based upon an actual memory cell, which is self-aligning to allow shared contact chains through an array of test cells. A first array of test cells is built to provide a chain of shared contact resistance. Using the first array of test cells, a resistance in the shared contact chain may be measured. A second array of test cells is built to provide a chain of shared contact resistance on the poly side of the shared contact. The resistance in the poly side chain may be measured to determine how much of shared contact resistance comes from the poly side of the shared contact. A third array of test cells is built to provide a chain of shared contact resistance on the island side of the shared contact. This resistance in the island side chain may be measured to determine how much of the shared contact resistance comes from the island side of the shared contact. A fourth array of test cells is built to provide a chain of island connection line resistance. Using the fourth array of test cells, a resistance in the island connection line chain may be measured. The island connection line resistance is used as a deduction from the shared contact resistance measured from the first and the third array in order to get the accurate values of the shared contact resistance. A fifth array of test cells is built to provide a chain of poly connection line resistance. Using the fifth array of test cells, a resistance in the poly connection line chain may be measured. The poly connection line resistance is used as a deduction from the shared contact resistance measured from the first and the second array in order to get the accurate values of the shared contact resistance.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A and 1B depict an example self-aligning memory cell in accordance with a preferred embodiment of the present invention;

FIG. 2 illustrates a main array of test cells and chain to measure the resistance of shared contact connecting the p-doped island to the poly in accordance with an exemplary embodiment of the present invention;

FIG. 3 illustrates a supplemental array of test cells and chain to measure the resistance of the poly-side of the shared contact in accordance with an exemplary embodiment of the present invention;

FIG. 4 illustrates a supplemental array of test cells and chain to measure the resistance of the shared contact on the island side of the shared contact in accordance with an exemplary embodiment of the present invention;

FIG. 5 illustrates a supplemental array of test cells and chain to quantify the resistance of the island connection lines in accordance with a preferred embodiment of the present invention;

FIG. 6 illustrates a supplemental array of test cells and chain to quantify the resistance of the poly connection lines in accordance with an exemplary embodiment of the present invention;

FIG. 7 depicts a test array connected to probing pads for measurement by a testing device in accordance with a preferred embodiment of the present invention;

FIG. 8 is a flowchart illustrating a process for performing a resistance measurement in accordance with a preferred embodiment of the present invention; and FIG. 9 is a flowchart illustrating a process for measuring shared contact resistance in a memory cell in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIGS. 1A and 1B, an example self-aligning memory cell is shown in accordance with a preferred embodiment of the present invention. The self-aligning memory cell includes highly doped P+ type silicon channels 102 and highly doped N+ type silicon channels 104. The doped channels are called diffusion. The cell is covered with insulation and polysilicon channels 106, 108, 110 are positioned over the insulation. Polysilicon (poly) is silicon in a polycrystal state. The poly is similar in conductivity to metal. An overlap of diffusion and poly forms a gate. Thus, transistors 122, 124 are formed at the overlap of the highly doped N+ type silicon channels 104 and the poly 106, as known in the art.

In a preferred embodiment of the present invention, the memory cell shown in FIG. 1A is self-aligning. Contact pads in the cell include normal square contact pads, such as contact pad 122, and shared contact pads 124, 126. Shared contact pad 124 connects p-doped island 102 to poly 110. Shared contact pad 126 connects n-doped island 104 to poly 108.

In a preferred embodiment of the present invention, test cells may be built based upon this actual self-aligning memory cell. When test cells are fabricated in an array, a plurality of components, such as shared contact pads 124 and 126, can be connected in series and tested together. As such, the memory cell shown in FIG. 1A is self-aligning to allow for an improved test array. FIG. 1B illustrates an example self-aligning memory cell with metal layer 130.

FIG. 2 illustrates a main array of test cells and chain to measure the resistance of shared contact connecting the p-doped island to the poly in accordance with an exemplary embodiment of the present invention. The test cell is built based on the original core cell, with slight modifications in order to build a chain of shared contact resistance. The test cells are arranged in an array of repeating, self-aligning cells. For example, test cell boundary 208 surrounds two such test cells. The test array may typically include thousands of such cells to truly reflect the real product.

Shared contact 204 connects poly 202 and p-doped island 206. The path of the chain flow 220 is also illustrated as an arrowed path through the test array. Since the test cell is built based on the SRAM core cell, the shape and connection of the shared contact with poly and island closely resembles the real core cell topology, so as to ensure an accurate measurement of the shared contact resistance. The path of chain flow 220 may follow the row of test cells and also snake back and forth through each row of the test array, flowing through each shared contact of interest.

FIG. 3 illustrates a supplemental array of test cells and chain to measure the resistance of the poly-side of the shared contact in accordance with an exemplary embodiment of the present invention. Again, the test cell is built based on the original core cell, with slight modifications in order to build a chain of poly-side resistance. A metal line 306 is used to bypass the island connection so that only the contact between poly and the shared contact is measured.

Shared contact 304 connects poly 302 and metal 306. The path of the chain flow 320 is illustrated as an arrowed path through the test array. Even with the slight modifications, the test cell is built based on the SRAM core cell. Therefore, the shape and connection of the shared contact with poly and island closely resembles the real core cell topology, so as to ensure an accurate measurement of the poly-side resistance in the shared contact. The path of chain flow 320 may follow the row of test cells and also snake back and forth through each row of the test array, flowing through each shared contact of interest. This supplemental structure may be used to differentiate whether a high resistance comes from the poly-side of the shared contact.

FIG. 4 illustrates a supplemental array of test cells and chain to measure the resistance of the shared contact on the island side of the shared contact in accordance with an exemplary embodiment of the present invention. Again, the test cell is built based on the original core cell, with slight modifications in order to build a chain of island-side resistance. A metal line 408 is used to bypass the poly connection in the chain so that only the resistance between the shared contact and the island is measured.

Shared contact 404 connects p-doped island 406 and metal 402. The path of the chain flow 420 is illustrated as an arrowed path through the test array. Even with the slight modifications, the test cell is built based on the SRAM core cell. Therefore, the shape and connection of the shared contact with poly and island closely resembles the real core cell topology, so as to ensure an accurate measurement of the island-side resistance in the shared contact. The path of chain flow 420 may follow the row of test cells and also snake back and forth through each row of the test array, flowing through each shared contact of interest. This supplemental structure may be used to differentiate whether a high resistance comes from the island-side of the shared contact.

FIG. 5 illustrates a supplemental array of test cells and chain to quantify the resistance of the island connection lines in accordance with a preferred embodiment of the present invention. As seen in FIG. 2, part of the resistance measured from the chain is from the island connection. The resistance of this portion should not be counted for the shared contact resistance and should be subtracted from the measured value.

The test cell is built based on the original core cell, with slight modifications in order to remove poly from the chain. A metal line 508 is used to bypass the island connection in the chain so that only the resistance between the shared contact and the island is measured. Shared contact 502 connects to p-doped island 504. The path of the chain flow 520 is illustrated as an arrowed path through the test array.

Even with the above-described modifications, the test cell is built based on the SRAM core cell. Therefore, the shape and connection of the shared contact with the island connection lines closely resembles the real core cell topology, so as to ensure an accurate measurement of the island connection lines resistance. The path of chain flow 520 may follow the row of test cells and also snake back and forth through each row of the test array, flowing through each island connection line of interest. This supplemental structure may be used to quantify the resistance of the island connection and to subtract this measured resistance form the shared contact resistance measured in the test structure of FIG. 2.

FIG. 6 illustrates a supplemental array of test cells and chain to quantify the resistance of the poly connection lines in accordance with an exemplary embodiment of the present invention. As seen in FIG. 2, part of the resistance measured from the chain is from the poly connection line. The resistance of this portion should not be counted for the shared contact resistance and should be subtracted from the measured value.

The test cell is built based on the original core cell, with slight modifications in order to remove the shared contact and n-doped channels from the chain. A poly connection line 602 is added to provide a poly connection chain through the test cell so that only the resistance of the poly connection line is measured. The path of the chain flow 620 is illustrated as an arrowed path through the test array. The path of chain flow 620 may follow the row of test cells and also snake back and forth through each row of the test array, flowing through each poly connection line of interest. This supplemental structure may be used to quantify the resistance of the poly connection and to subtract this measured resistance form the shared contact resistance measured in the test structure of FIG. 2.

FIG. 2 illustrates the main test structure and FIGS. 3–6 illustrate supplemental test structures to FIG. 2. The supplemental test structures help to detail and differentiate the results obtained using the test structure of FIG. 2. Using the same techniques, the shared contact to n-doped island and poly in the SRAM core cell may be characterized as well.

FIG. 7 depicts a test array connected to probing pads for measurement by a testing device in accordance with a preferred embodiment of the present invention. Pad 1 702 and pad 2 704 provide probing points for testing device 720. Probe 722 contacts pad 1 702 and probe 724 contacts pad 2 704. Pad 1 is connected to test array 706 through metal line 708. Pad 2 is connected to test array 706 through metal line 710.

Testing device 720 measures the resistance of the test array by providing current through probes 722, 724. The test array 706 may be the main test structure or any one of the supplemental test structures. Using the various measurements, the testing device may obtain an accurate determination of shared contact resistance. The testing device may also determine how much shared contact resistance comes from the poly-side and how much comes from the island-side.

FIG. 8 is a flowchart illustrating a process for performing a resistance measurement in accordance with a preferred embodiment of the present invention. The process begins and component to test within the memory cell is identified (step 802). Then, one builds an array of test cells, based on an original core cell, to build a chain of component resistance (step 804). A metal line is applied to bypass components, if necessary (step 806) and a poly line is applied to bypass components, if necessary (step 808). Then, a tester applied current to the test array (step 810) and measures the resistance in a chain through the test array (step 812). Thereafter, the process ends.

FIG. 9 is a flowchart illustrating a process for measuring shared contact resistance in a memory cell in accordance with a preferred embodiment of the present invention. The process begins and provides an array of test cells, based on an original core cell, to build a chain of shared contact resistance (step 902). Then, a tester measures resistance in the shared contact chain (step 904).

Next, the process provides an array of test cells to build a chain of poly-side resistance (step 906). A tester measures resistance in the poly side of the shared contact in the chain (step 908). Then, the process determines how much resistance comes from the poly-side of the shared contact (step 910). Thereafter, the process provides an array of test cells to build a chain of island-side resistance (step 912). A tester measures resistance in the island side of the shared contact in the chain (step 914). Then, the process determines how much resistance comes from the island-side of the shared contact (step 916).

Thereafter, the process provides an array of test cells to build a chain of island connection line resistance (step 918). A tester measures the island connection line resistance in the chain (step 920) and the process subtracts the island connection line resistance from the measured shared contact resistance (step 922). Next, the process provides an array of test cells to build a chain of poly connection line resistance (step 924). A tester measures the poly connection line resistance in the chain (step 926) and the process subtracts the poly connection line resistance from the measured shared contact resistance (step 928). Thereafter, the process ends.

As the present invention provides test structures that are based on an original memory core cell, the shape and connection of the shared contact with poly and island closely resembles the real core cell topology, so as to ensure an accurate measurement of the shared contact resistance. Due to variation of the optical proximity correction (OPC) on the layers of contact, island, and poly, different environment and/or density of the shared contact, regular contact, island, and poly may render difference on the size of contact and its touching area on silicon and poly. The present invention places the shared contact in as close an environment to an actual memory core as possible. The present invention also allows one to differentiate which side of the shared contact resistance (contact to poly or contact to island) is high, if the measured contact resistance is high, hence to provide a very constructive guidance for the layout design and/or process adjustment. Furthermore, the present invention allows one to quantify the resistance of shared contact to island and shared contact to poly separately.

What is claimed is:

1. A method for measuring shared contact resistance in a memory cell design, the method comprising:

providing a first test array of main test structures based on a real memory product, wherein each main test structure includes at least one shared contact and wherein the first test array builds a chain of shared contact resistance from a first contact point to a second contact point;

applying voltage to the first test array from the first contact point to the second contact point;

measuring shared contact resistance in the chain of shared contact resistance;

providing a second test array of first supplemental test structures based on the real memory product, wherein each first supplemental test structure includes at least one shared contact and wherein the second test array builds a chain of shared contact resistance on a silicon island side of the shared contacts in the second test array from a first contact point to a second contact point;

applying voltage to the second test array from the first contact point to the second contact point; and measuring silicon island side resistance in the chain of shared contact resistance on the silicon island side of the shared contacts in the second test array.

2. The method of claim 1, further comprising:
subtracting the measured silicon island side resistance from the measured shared contact resistance to determine a poly side resistance.

3. The method of claim 1, further comprising:
providing a third test array of second supplemental test structures based on the real memory product, wherein each second supplemental test structure includes at least one shared contact and wherein the third test array builds a chain of shared contact resistance on a poly side of the shared contacts in the third test array from a first contact point to a second contact point;
applying voltage to the third test array from the first contact point to the second contact point; and
measuring poly side resistance in the chain of shared contact resistance on the poly side of the shared contacts in the third test array.

4. The method of claim 3, further comprising:
subtracting the measured poly side resistance from the measured shared contact resistance to determine a silicon island side resistance.

5. The method of claim 1, further comprising:
providing a fourth test array of third supplemental test structures based on the real memory product, wherein the fourth test array builds a chain of silicon island connection line resistance in the fourth test array from a first contact point to a second contact point;
applying voltage to the fourth test array from the first contact point to the second contact point; and
measuring silicon island connection line resistance in the chain of silicon island connection line resistance in the fourth test array.

6. The method of claim 5, further comprising:
subtracting the measured silicon island connection line resistance from the measured shared contact resistance.

7. The method of claim 5, further comprising:
providing a fifth test array of fourth supplemental test structures based on the real memory product, wherein the fifth test array builds a chain of poly connection line resistance in the fifth test array from a first contact point to a second contact point;
applying voltage to the fifth test array from the first contact point to the second contact point; and
measuring poly connection line resistance in the chain of poly connection line resistance in the fifth test array.

8. The method of claim 7, further comprising:
subtracting the measured poly connection line resistance from the measured shared contact resistance.

9. The method of claim 7, further comprising:
subtracting the measured silicon island connection line resistance and the measured poly connection line resistance from the measured shared contact resistance.

10. An apparatus for measuring shared contact resistance in a memory cell design, the apparatus comprising:
a first test array of main test structures based on a real memory product, wherein each main test structure includes at least one shared contact and wherein the first test array builds a chain of shared contact resistance from a first contact point to a second contact point;
a tester, wherein the tester applies a voltage to the first test array from the first contact point to the second contact point and measures shared contact resistance in the chain of shared contact resistance;
a second test array of first supplemental test structures based on the real memory product, wherein each first supplemental test structure includes at least one shared contact and wherein the second test array builds a chain of shared contact resistance on a silicon island side of the shared contacts in the second test array from a first contact point to a second contact point,
wherein the tester applies a voltage to the second test array from the first contact point to the second contact point and measures silicon island side resistance in the chain of shared contact resistance on the silicon island side of the shared contacts in the second test array.

11. The apparatus of claim 10, wherein the tester subtracts the measured silicon island side resistance from the measured shared contact resistance to determine a poly side resistance.

12. The apparatus of claim 10, further comprising:
a third test array of second supplemental test structures based on the real memory product, wherein each second supplemental test structure includes at least one shared contact and wherein the third test array builds a chain of shared contact resistance on a poly side of the shared contacts in the third test array from a first contact point to a second contact point,
wherein the tester applies a voltage to the third test array from the first contact point to the second contact point and measures poly side resistance in the chain of shared contact resistance on the poly side of the shared contacts in the third test array.

13. The apparatus of claim 12, wherein the tester subtracts the measured poly side resistance from the measured shared contact resistance to determine a silicon island side resistance.

14. The apparatus of claim 10, further comprising:
a fourth test array of third supplemental test structures based on the real memory product, wherein the fourth test array builds a chain of silicon island connection line resistance in the fourth test array from a first contact point to a second contact point,
wherein the tester applies a voltage to the fourth test array from the first contact point to the second contact point and measures silicon island connection line resistance in the chain of silicon island connection line resistance in the fourth test array.

15. The apparatus of claim 14, wherein the tester subtracts the measured silicon island connection line resistance from the measured shared contact resistance.

16. The apparatus of claim 14, further comprising:
a fifth test array of fourth supplemental test structures based on the real memory product, wherein the fifth test array builds a chain of poly connection line resistance in the fifth test array from a first contact point to a second contact point,
wherein the tester applies voltage to the fifth test array from the first contact point to the second contact point and measures poly connection line resistance in the chain of poly connection line resistance in the fifth test array.

17. The apparatus of claim 16, wherein the tester subtracts the measured poly connection line resistance from the measured shared contact resistance.

18. The apparatus of claim 16, wherein the tester subtracts the measured silicon island connection line resistance and the measured poly connection line resistance from the measured shared contact resistance.

* * * * *